United States Patent
Kim et al.

(10) Patent No.: US 9,324,941 B2
(45) Date of Patent: Apr. 26, 2016

(54) SEMICONDUCTOR DEVICES AND METHODS FOR FABRICATING THE SAME

(71) Applicants: Whankyun Kim, Seoul (KR); Woojin Kim, Yongin-si (KR); Woo Chang Lim, Seoul (KR)

(72) Inventors: Whankyun Kim, Seoul (KR); Woojin Kim, Yongin-si (KR); Woo Chang Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/306,976

(22) Filed: Jun. 17, 2014

(65) Prior Publication Data

US 2015/0104883 A1 Apr. 16, 2015

(30) Foreign Application Priority Data

Oct. 15, 2013 (KR) ........................ 10-2013-0122870

(51) Int. Cl.
| | | |
|---|---|---|
| *H01L 21/00* | (2006.01) | |
| *H01L 43/12* | (2006.01) | |
| *C23C 14/35* | (2006.01) | |
| *H01L 43/08* | (2006.01) | |
| *C23C 14/04* | (2006.01) | |
| *H01J 37/34* | (2006.01) | |
| *H01L 27/22* | (2006.01) | |

(52) U.S. Cl.
CPC .............. *H01L 43/12* (2013.01); *C23C 14/046* (2013.01); *C23C 14/35* (2013.01); *H01J 37/3408* (2013.01); *H01L 27/228* (2013.01); *H01L 43/08* (2013.01)

(58) Field of Classification Search
CPC .............................. H01L 27/222; H01L 43/08
See application file for complete search history.

(56) References Cited

U.S. PATENT DOCUMENTS

| | | | | |
|---|---|---|---|---|
| 5,723,382 | A | * | 3/1998 | Sandhu .................. C23C 16/34 257/E21.168 |
| 6,187,673 | B1 | * | 2/2001 | Lai ..................... H01L 21/28556 257/E21.17 |
| 8,231,767 | B2 | | 7/2012 | Iori et al. |
| 8,282,794 | B2 | | 10/2012 | Gorokhovsky |
| 2010/0294656 | A1 | | 11/2010 | Ikeda et al. |
| 2012/0097534 | A1 | | 4/2012 | Takahashi et al. |
| 2012/0152728 | A1 | | 6/2012 | Yamazaki |
| 2012/0193693 | A1 | | 8/2012 | Kanaya |

FOREIGN PATENT DOCUMENTS

| | | |
|---|---|---|
| KR | 101028364 B1 | 4/2011 |
| KR | 20110042238 A | 4/2011 |
| KR | 101067634 B1 | 9/2011 |
| KR | 101160919 B1 | 6/2012 |
| KR | 20120089795 A | 8/2012 |
| KR | 20120089989 A | 8/2012 |
| WO | WO-2011030826 A1 | 3/2011 |

OTHER PUBLICATIONS

Gil Heyun Choi, Advanced Metallization Technology, May 7, 2011, Samsung Electronics Co., LTD., pp. 1-87.

* cited by examiner

*Primary Examiner* — Richard Booth
(74) *Attorney, Agent, or Firm* — Harness, Dickey & Pierce, P.L.C.

(57) ABSTRACT

A method of fabricating a semiconductor device includes providing a wafer in a chamber of a point-cusp magnetron physical vapor deposition (PCM-PVD) apparatus, the chamber including a metal target. The method further includes providing an inert gas and a reactive gas in the chamber and forming an amorphous conductive layer on the wafer by reacting the reactive gas with a metal atom separated from the metal target by the inert gas.

18 Claims, 17 Drawing Sheets

SEMICONDUCTOR DEVICES AND METHODS FOR FABRICATING THE SAME

CROSS-REFERENCE TO RELATED APPLICATIONS

This U.S. nonprovisional patent application claims priority under 35 U.S.C. §119 of Korean Patent Application 10-2013-0122870 filed on Oct. 15, 2013, the entire contents of which are hereby incorporated by reference.

BACKGROUND

1. Field

Some example embodiments of the present inventive concepts relate to semiconductor devices and/or methods for fabricating the same.

2. Description of the Related Art

To keep up with the trend of higher speeds and lower consumption, memory devices in electronic appliances need a relatively high read/write speed and relatively low voltage. Magnetic memory devices have been developed to satisfy that need. The magnetic memory devices are spotlighted as next generation memory devices because they have relatively high speed and/or nonvolatile characteristics.

Magnetic memory devices generally include a magnetic tunnel junction pattern. The magnetic tunnel junction pattern includes an insulating layer interposed between two magnetic layers and its resistance changes according to the orientation of the magnetization in the two magnetic layers. For example, the magnetic tunnel junction pattern has a greater resistance when the magnetization directions of the two magnetic layers are anti-parallel, and has a lower resistance when the magnetization directions of the two magnetic layers are parallel. This difference of resistance can be used to read and write data.

SUMMARY

Some example embodiments of the present inventive concepts provide a method for fabricating a semiconductor device capable of forming an amorphous metal nitride layer or metal oxide layer having improved step coverage.

Other example embodiments of the present inventive concepts provide a semiconductor device having an improved magnetoresistance ratio.

According to an example embodiment of the present inventive concepts, a method for fabricating a semiconductor device includes providing a wafer in a chamber of a point-cusp magnetron physical vapor deposition (PCM-PVD) apparatus, the chamber including a metal target, providing an inert gas and a reactive gas in the chamber, and forming an amorphous conductive layer on the wafer by reacting the reactive gas with a metal atom separated from the metal target by the inert gas.

In an example embodiment, the wafer may include an interlayer dielectric layer formed thereon. The interlayer dielectric layer may include a recess region. The amorphous conductive layer may comprise one of an amorphous metal nitride layer and an amorphous metal oxide layer filling the recess region.

In an example embodiment, the recess region may comprise a contact hole. The method may further comprise forming a crystalline conductive pattern filling a lower part of the contact hole before forming the amorphous conductive layer. In an example embodiment, the crystalline conductive pattern may be formed by a chemical vapor deposition process. In an example embodiment, the reactive gas may include at least one of nitrogen, ammonia, oxygen, and vapor.

In an example embodiment, the amorphous conductive layer may be formed to include an amorphous metal nitride layer. The amorphous metal nitride layer may include an amorphous titanium nitride layer having an amount of nitrogen that is 3/10 or less than an amount of titanium. In an example embodiment, the method may further comprise unloading the wafer from the chamber, and forming one of a magnetic tunnel junction pattern and a metal line pattern on the amorphous titanium nitride layer.

According to another example embodiment of the present inventive concepts, a magnetic memory device includes an amorphous titanium nitride layer on a substrate and a magnetic tunnel junction pattern on the amorphous titanium nitride layer. An amount of nitrogen in the amorphous titanium nitride layer is 3/10 or less than an amount of titanium in the amorphous titanium nitride layer.

In another example embodiment, the device may further comprise an interlayer dielectric layer on the substrate, and the interlayer dielectric layer may include a hole. The amorphous titanium nitride layer may constitute a contact plug filling the hole.

In another example embodiment, the device may further comprise a contact plug between the substrate and the amorphous titanium nitride layer. The amorphous titanium nitride layer may constitute a lower electrode. In another example embodiment, the lower electrode may comprise a sidewall aligned with a sidewall of the magnetic tunnel junction pattern.

In another example embodiment, the magnetic tunnel junction pattern may comprise a first magnetic layer, a tunnel barrier layer, and a reference layer on the amorphous titanium nitride layer. The reference layer may include a second magnetic layer, a capping layer, a first pinned layer, an exchange-coupling layer, and a second pinned layer that are sequentially stacked on the tunnel barrier layer. In another example embodiment, the contact plug may comprise a crystalline conductive pattern under the amorphous titanium nitride layer.

According to yet another example embodiment of the present inventive concepts, a magnetic memory device includes an amorphous titanium nitride layer and a metal line sequentially stacked on a substrate. An amount of nitrogen in the amorphous titanium nitride layer is 3/10 or less than an amount of titanium in the amorphous titanium nitride layer.

According to still yet another example embodiment of the present inventive concepts, a method for fabricating a magnetic memory device includes patterning an interlayer dielectric layer on a substrate to form a recess region therein, forming a contact plug filling the recess region, the contact plug including an amorphous titanium nitride layer, and forming a magnetic tunnel junction pattern on the contact plug.

In another example embodiment, the contact plug may be formed to include the amorphous titanium nitride layer having an amount of nitrogen that is 3/10 or less than an amount of titanium. In another example embodiment, the contact plug may be formed to include the amorphous titanium nitride layer constituting a lower electrode.

In another example embodiment, the contact plug may be formed to include the amorphous titanium nitride layer including a sidewall aligned with a sidewall of the magnetic tunnel junction pattern. In another example embodiment, forming the magnetic tunnel junction pattern may include forming a first magnetic layer, a tunnel barrier layer, and a reference layer on the amorphous titanium nitride layer, the reference layer including a second magnetic layer, a capping layer, a first pinned layer, an exchange-coupling layer, and a second pinned layer that are sequentially stacked on the tunnel barrier layer. In another example embodiment, the contact plug may be formed to include a crystalline conductive pattern under the amorphous titanium nitride layer.

According to another example embodiment of the inventive concepts, a method for fabricating a magnetic memory device includes forming at least one interlayer dielectric layer on a substrate, forming a lower contact plug penetrating at least a first portion of the at least one interlayer dielectric layer by a chemical vapor deposition process (CVD), forming an upper contact plug penetrating at least a second portion of the at least one interlayer dielectric layer by a point-cusp magnetron physical vapor deposition (PCM-PVD) process, forming a lower electrode on the at least one interlayer dielectric layer, and forming a magnetic tunnel junction pattern on the lower electrode.

In another example embodiment, the lower contact plug may be formed to have a crystalline structure, and the upper contact plug may be formed to have an amorphous structure. In another example embodiment, the method may further comprise patterning the at least one interlayer dielectric layer to form a contact hole in the at least one interlayer dielectric layer prior to the forming a lower contact plug, and the lower contact plug may fill the contact hole. In another example embodiment, the method may further comprise performing an etch-back process to recess an upper portion of the lower contact plug prior to the forming an upper contact plug, and the upper contact plug may be formed in the recessed upper portion.

In another example embodiment, forming the at least one interlayer dielectric layer includes forming first and second interlayer dielectric layers on the substrate, the lower contact plug may be formed to penetrate the first interlayer dielectric layer, and the upper contact plug may be formed to penetrate the second interlayer dielectric layer. In another example embodiment, the lower electrode may be formed to include an amorphous titanium nitride layer having an amount of nitrogen that is $3/10$ or less than an amount of titanium.

In another example embodiment, forming the magnetic tunnel junction pattern includes forming a first magnetic layer, a tunnel barrier layer, and a reference layer on the lower electrode, the reference layer including a second magnetic layer, a capping layer, a first pinned layer, an exchange-coupling layer, and a second pinned layer that are sequentially stacked on the tunnel barrier layer.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION

Figure 1:
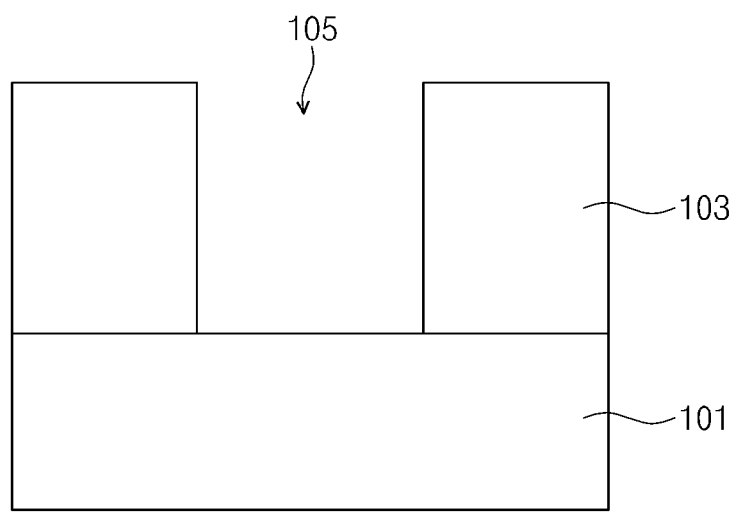
FIGS. 1 and 2 are cross-sectional views illustrating a method for fabricating a semiconductor device according to an example embodiment of the present inventive concepts.

Example embodiments of the present inventive concepts will be described below in more detail with reference to the accompanying drawings. The present inventive concepts may, however, be embodied in different forms and should not be constructed as limited to the embodiments set forth herein. Rather, these embodiments are provided so that this disclosure will be thorough and complete, and will fully convey the scope of the present inventive concepts to those skilled in the art. Like numerals refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
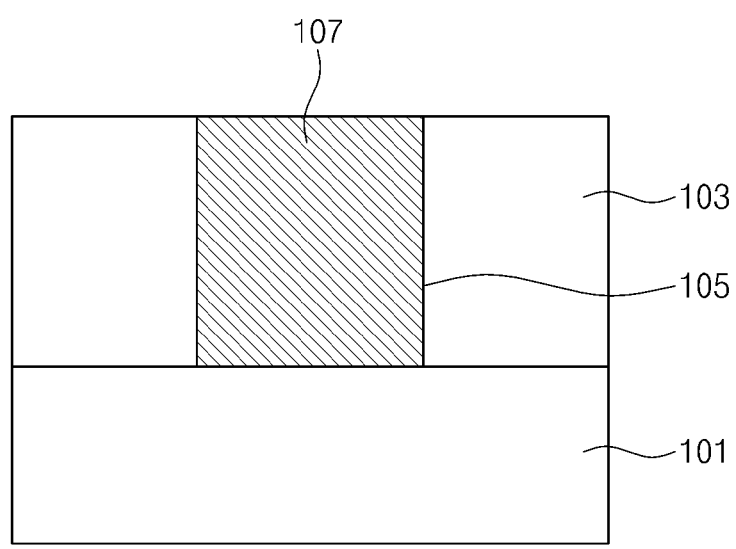
Figure 3:
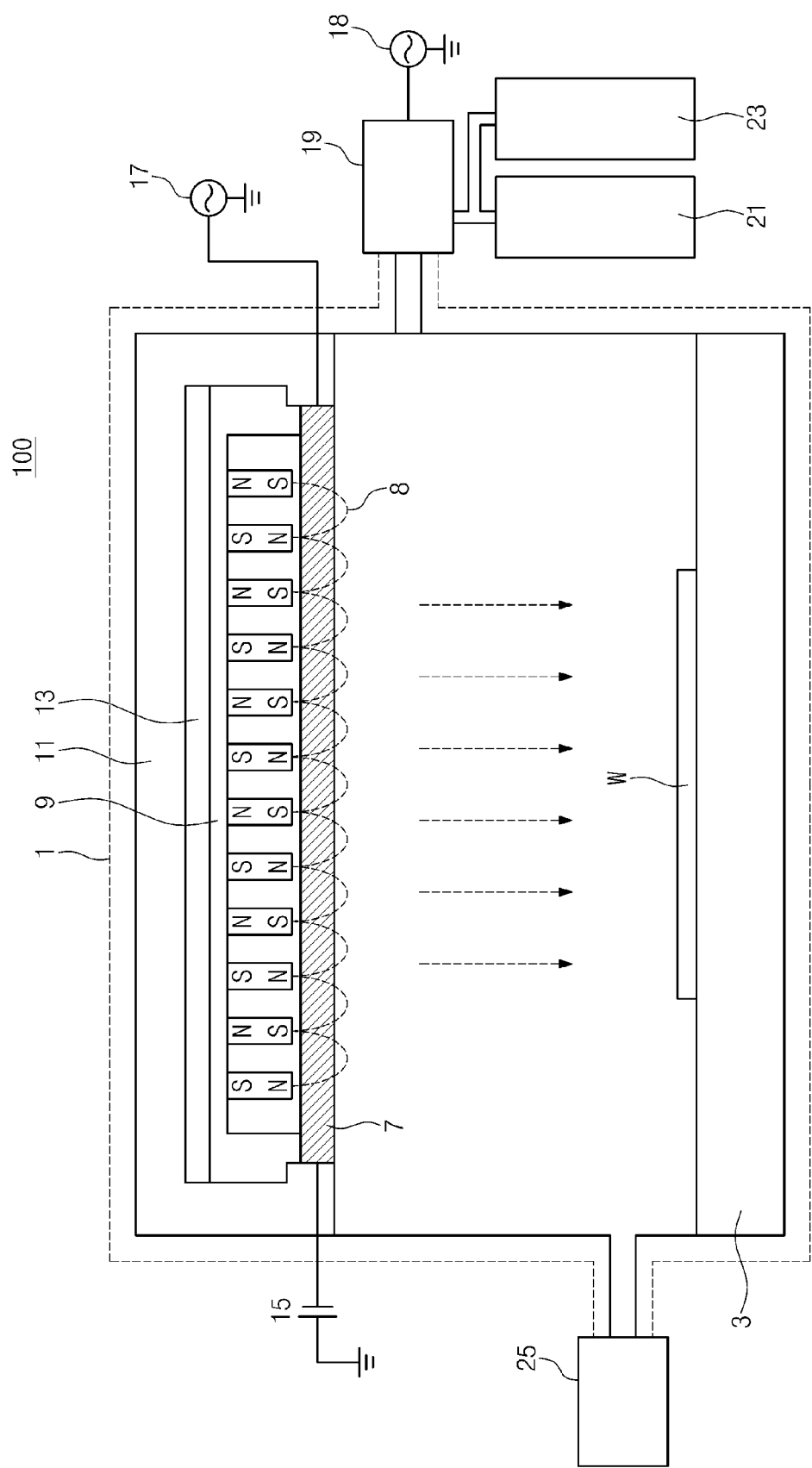
FIG. 3 is a cross-sectional view illustrating a chamber of PCM-PVD according to an example embodiment of the present inventive concepts.

FIGS. 1 and 2 are cross-sectional views illustrating a method for fabricating a semiconductor device according to an example embodiment of the present inventive concepts. FIG. 3 is a cross-sectional view illustrating a chamber of PCM-PVD according to an example embodiment of the present inventive concepts.

Referring to FIG. 1, an interlayer dielectric layer 103 may be formed on a substrate 101. The interlayer dielectric layer 103 may be patterned to form a recess region 105. The recess region 105 may have a hole shape.

Referring to FIG. 2, a contact plug 107 may be formed to fill the recess region 105. The contact plug 107 may include an amorphous metal nitride layer or an amorphous metal oxide layer. The contact plug 107 may be formed of an amorphous titanium nitride layer. The contact plug 107 may be formed using a point-cusp magnetron physical vapor deposition (PCM-PVD) apparatus 100 as illustrated in FIG. 3 such that the contact plug 107 may have an improved gap-fill characteristic without voids or seams.

Referring to FIG. 3, the PCM-PVD apparatus 100 may include a chamber 1 having a wafer holder 3 on which a wafer W is disposed. The wafer holder 3 may act as an electrostatic chuck and/or a lower electrode. The wafer holder 3 may be applied by a substrate bias. A metal target 7 may be disposed on a side that faces the wafer W. The metal target 7 may comprise only metal. For example, the metal target 7 may be composed of titanium. The metal target 7 may act as an upper electrode. The metal target 7 may be connected to a first radio frequency power supply 17 and a direct current power supply 15. The metal target 7 may be fixed by a first fixing member 11. A plurality of magnets 9 may arrange on the metal target 7. The magnets 9 may be fixed by a second fixing member 13. The magnets 9 may be regularly arrayed such that every set of two adjacent magnets 9 may have different polarities. The magnets 9 may be evenly spaced apart at regular intervals. The magnets 9 may produce a point-cusp magnetic field 8 on a surface of the metal target 7. The first fixing member 11 may include an insulator. The second fixing member 13 may rotate around its central axis. The chamber 1 may be connected to an inert gas tank 21 and a reaction gas tank 23. A mass flow controller 19 may be provided between the chamber 1 and the tanks 21 and 23. The mass flow controller 19 may be connected to a second radio frequency power supply 18. The inert gas tank 21 may store Ar or Kr. The reaction gas tank 23 may store one of nitrogen, ammonia, oxygen, and vapor (or water). The chamber 1 may be connected to a vacuum pump 25.

The wafer W may be loaded in the chamber 1. The wafer W may comprise the substrate 101 and the interlayer dielectric layer 103 having the recess region 105 stacked on the substrate 101 as illustrated in FIG. 1. The inert gas may be provided from the inert gas tank 21 into the chamber 1 to create plasma, and the plasma may collide with the metal target 7 to separate metal atoms from the metal target 7. The separated metal atoms may react with the reaction gas from the reaction gas tank 32 to form a metal nitride or a metal oxide. The metal nitride or metal oxide may move into a surface of the wafer W to fill the recess region 105. As such, the contact plug 107 may be formed. The point-cusp magnetic field 8 produced by the magnets 9 may concentrate the plasma in a magnetic field to promote a collision between the metal target 7 and the plasma, thereby increasing deposition yields and improving step coverage. Moreover, a composition of deposition layer may be adjusted using the metal target 7 composed of pure metal and proper regulating the reaction gas flows. If a sputtering process is performed under a condition that provision of the inert gas and the use of metal target 7 composed of metal nitride layer or metal oxide layer, a metal nitride layer or a metal oxide layer may be formed on the wafer W. In this sputtering process of an example embodiment, a composition of the metal nitride layer or the metal oxide layer may be identical to that of the metal target 7 and the composition may not be easy to adjust.

According to some example embodiments, the metal target 7 may be formed of titanium and the reaction gas may be nitrogen. For example, the nitrogen may be supplied at a flow rate of about 10 sccm to about 20 sccm. The inert gas may be argon. The argon may be supplied at a pressure of about 10 Pa to about 20 Pa. The first radio frequency power supply 17 may provide electric power of about 1000 W, and the direct current power supply 15 may provide electric power of about 100 W to about 600 W. Bias power of about 10 W to about 50 W may apply to the wafer holder 3. Under these conditions, an amorphous titanium nitride layer may be deposited on the wafer W. An amount of nitrogen in the amorphous titanium nitride layer may be $3/10$ or less than an amount of titanium in the amorphous titanium nitride layer. If the amount of nitrogen is more than $3/10$, the titanium nitride layer may have a crystalline structure or become crystalline. In this case, the crystalline structure of the titanium nitride layer may have an undesirable effect on a crystallization of metal line or magnetic tunnel junction pattern which will be formed on the titanium nitride layer in a succeeding process.

The amorphous metal nitride layer or metal oxide layer may fill the recess region 105 and further formed on the interlayer dielectric layer 103. After unloading the wafer W from the chamber 1, the amorphous metal nitride layer or metal oxide layer on the interlayer dielectric layer 103 may be removed by a succeeding planarization process.

The formation of the amorphous metal nitride layer or metal oxide layer may be applicable to various methods for fabricating semiconductor devices. Detailed descriptions will be explained below.

FIGS. 4 to 12 are perspective views illustrating a method for fabricating a magnetic memory device according to an example embodiment of the present inventive concepts.

Figure 4:
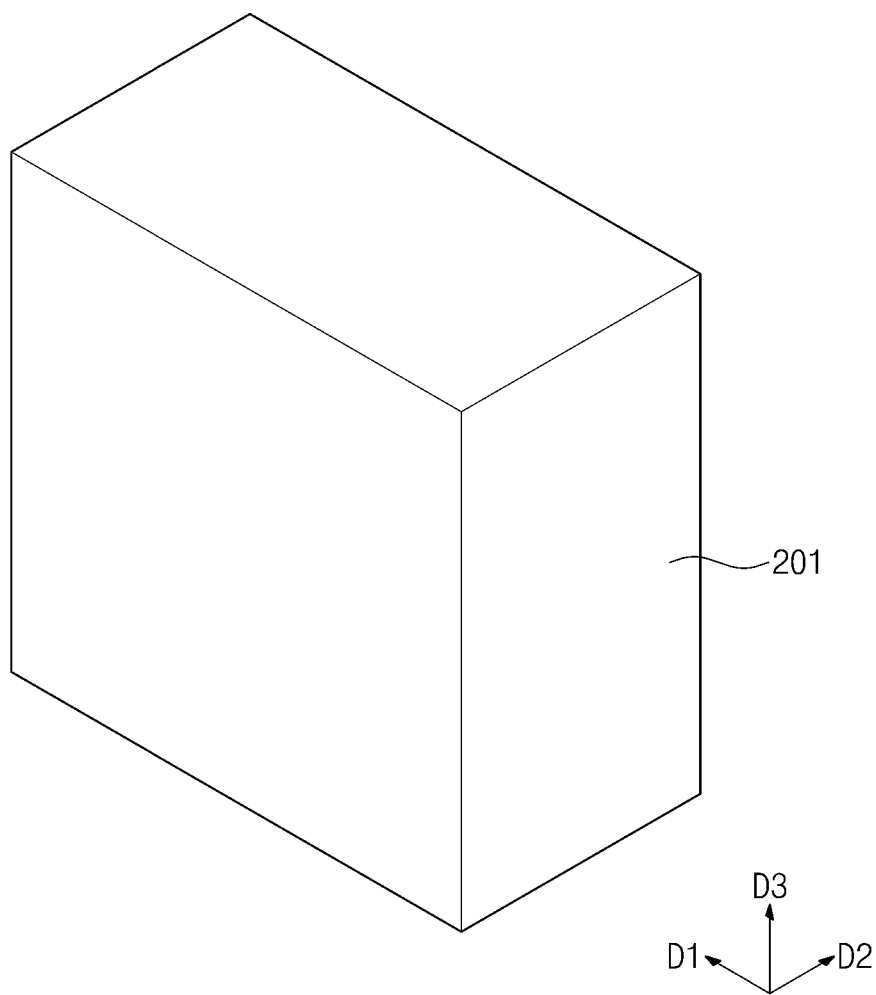
FIGS. 4 to 12 are perspective views illustrating a method for fabricating a magnetic memory device according to an example embodiment of the present inventive concepts.

Referring to FIG. 4, a substrate 201 may be provided. The substrate 201 may be a single crystalline silicon wafer or a SOI substrate. The substrate 201 may be doped with p-type impurities.

Figure 5:
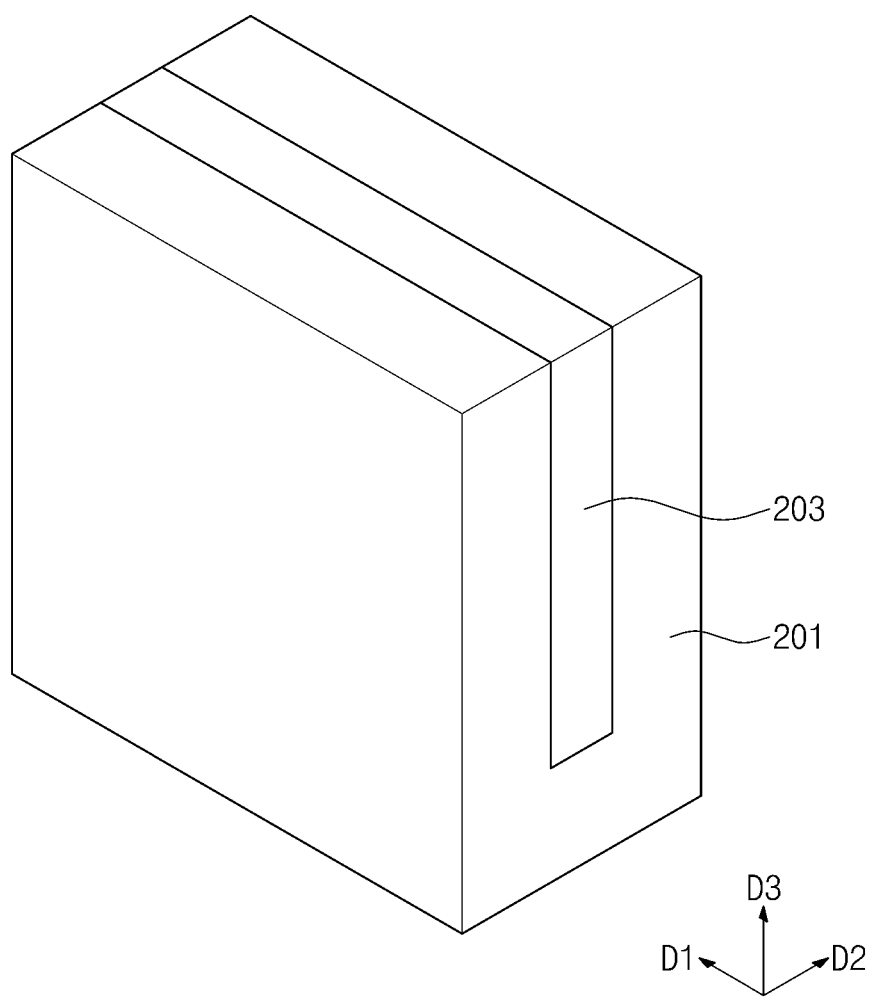

Referring to FIG. 5, a device isolation layer 203 may be formed at the substrate 201 to define an active region. The device isolation layer 203 may have a line type which extends in a first direction D1.

Figure 6:
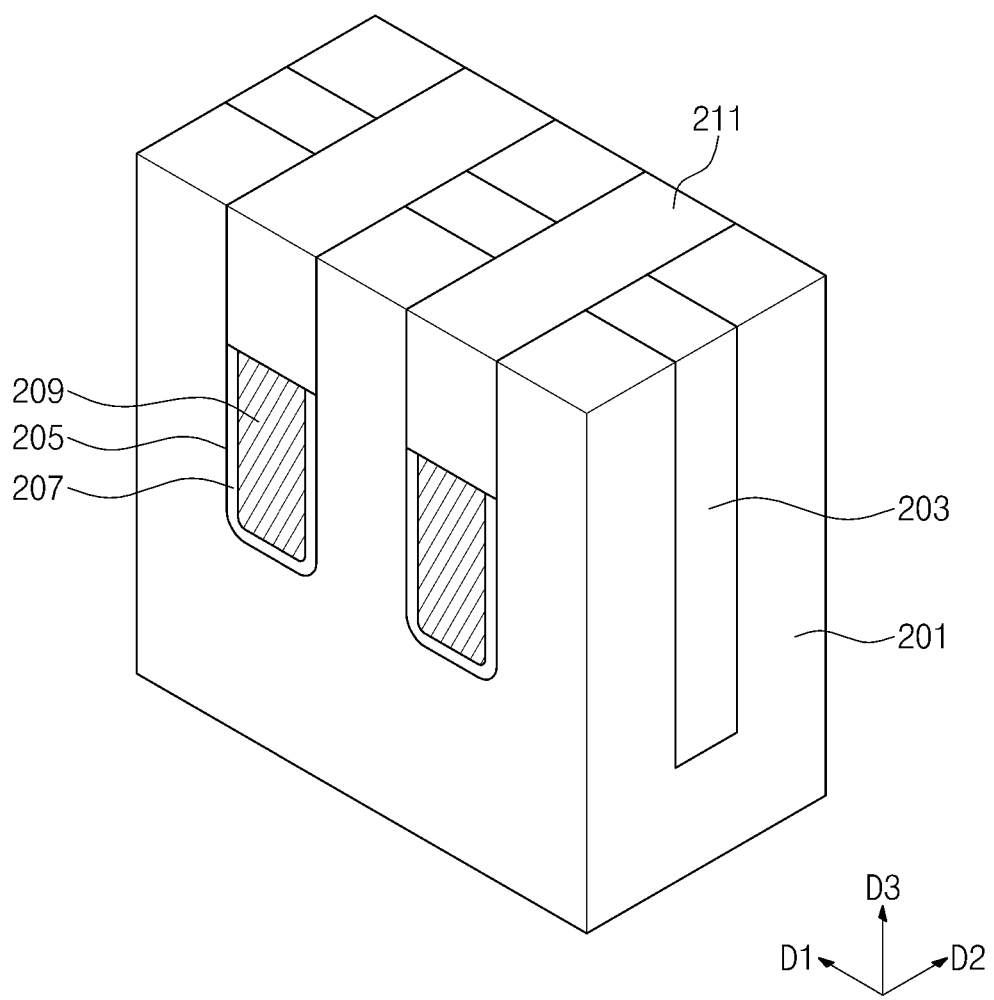

Referring to FIG. 6, the substrate 201 and the device isolation layer 203 may be patterned to form a plurality of grooves 205 which extend in a second direction D2 crossing the first direction D1. A gate dielectric layer 207 and a gate line 209 may be formed in the groove 205. The gate dielectric layer 207 and the gate line 209 may be recessed to remove upper portions thereof and a capping layer 211 may be formed to fill the groove 205. The gate dielectric layer 207 may comprise a silicon nitride layer. The gate line 209 may include a metal nitride layer or a tungsten layer. The capping layer 211 may be formed of a silicon nitride layer.

Figure 7:
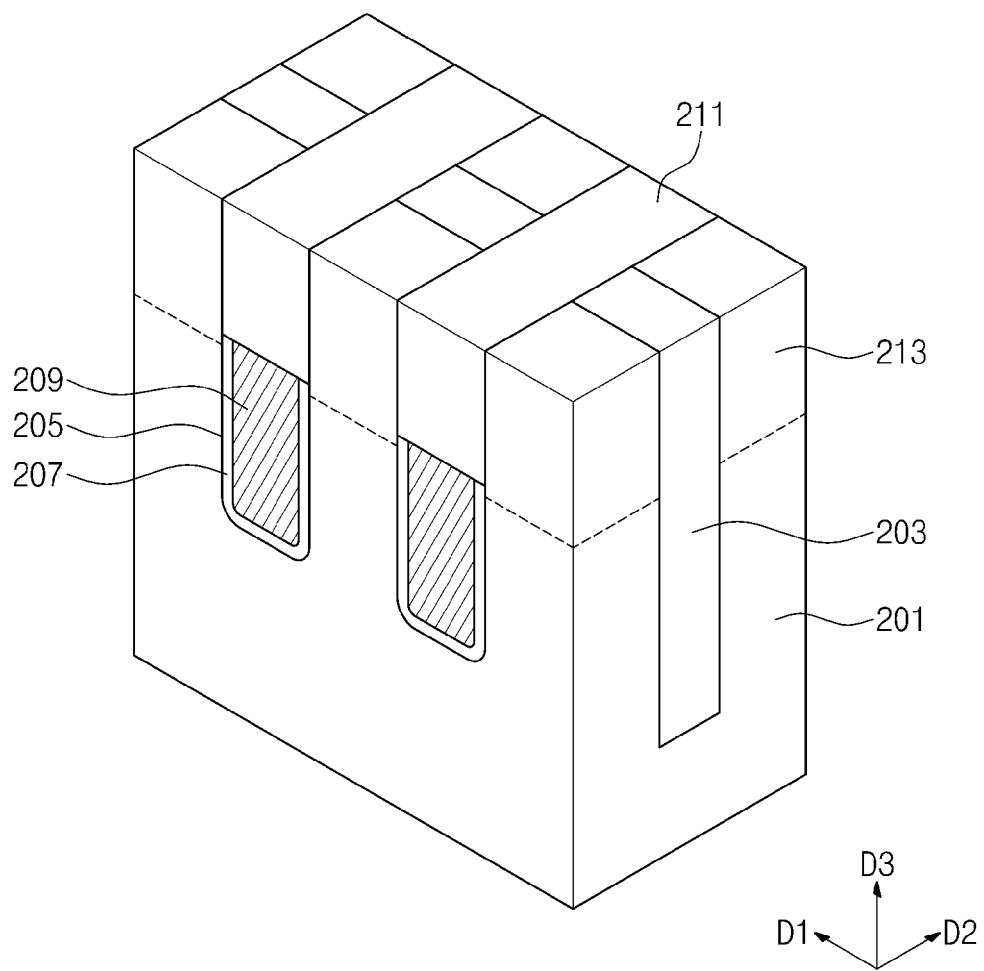

Referring to FIG. 7, upper portions of the substrate 201 may be implanted to form source/drain regions 213. The source/drain regions 213 may be doped with n-type impurities.

Figure 8:
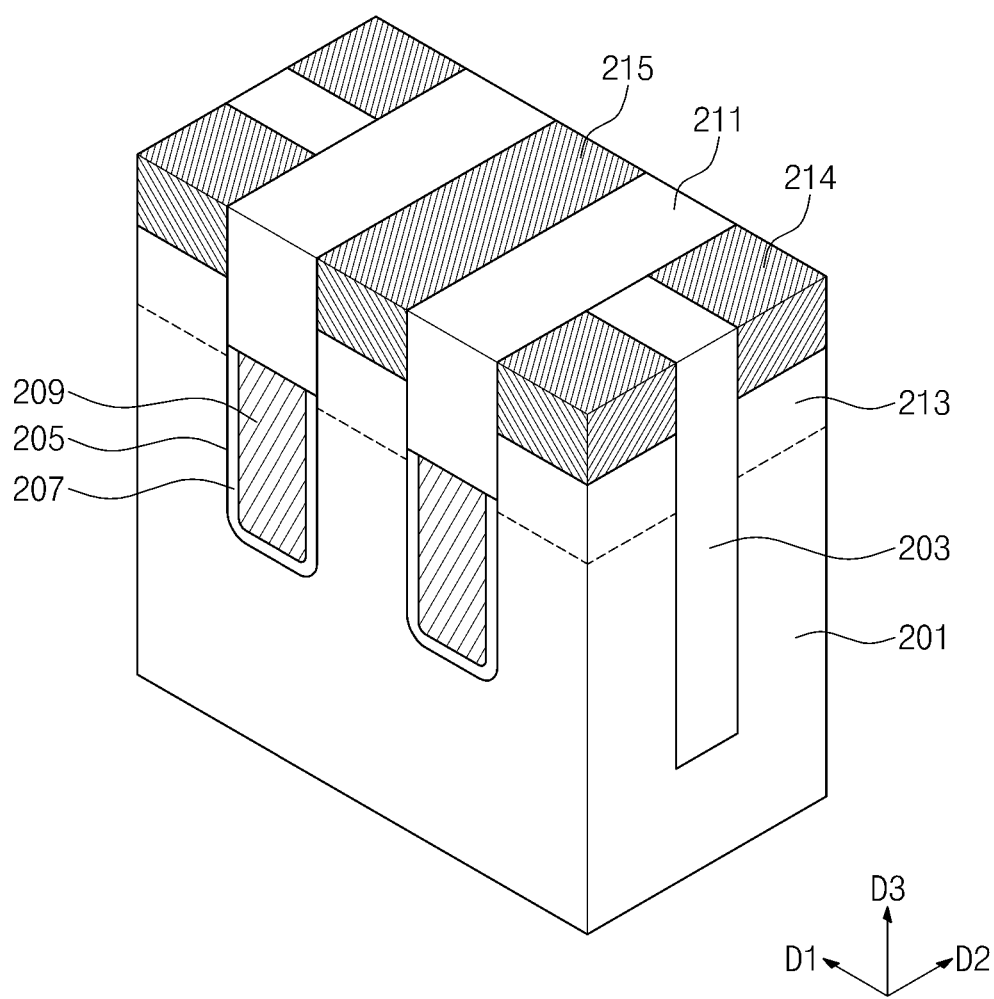

Referring to FIG. 8, a portion of the device isolation layer 203 between adjacent two capping layers 211 may be recessed. The recessed portion of the device isolation layer 203 may be filled with polysilicon and then planarized. A first metal silicide pattern 214 may be formed on the source/drain region 213 at one side of the capping layer 211, and a second metal silicide pattern 215 may be formed on the source/drain region 213 between the adjacent two capping layers 211. The second metal silicide pattern 215 may have a line shape which extends in the second direction D2.

Figure 9:
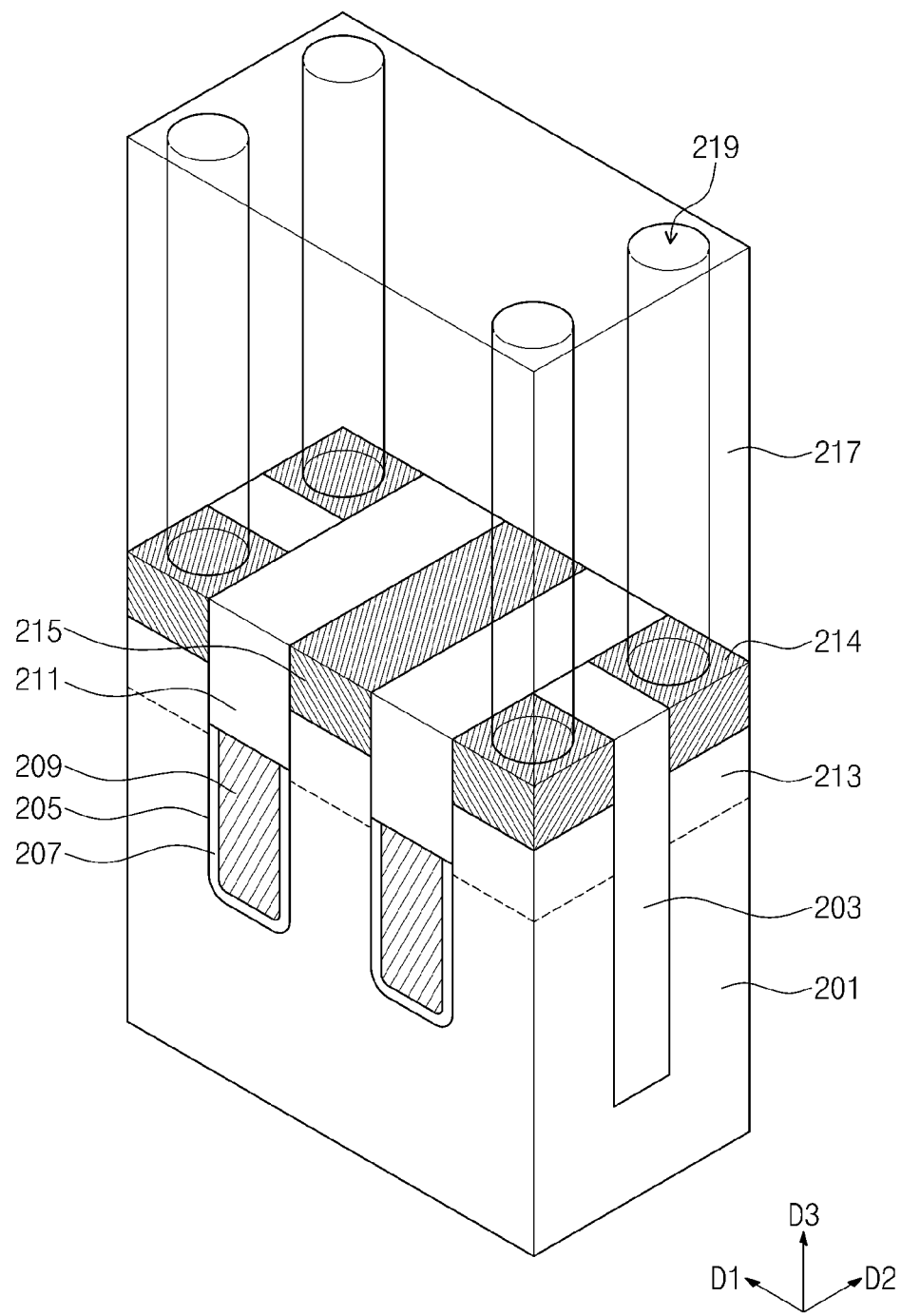

Referring to FIG. 9, an interlayer dielectric layer 217 may be formed to cover the substrate 201. The interlayer dielectric layer 217 may be patterned to form a contact hole 219 that exposes the first metal silicide pattern 214.

Figure 10:
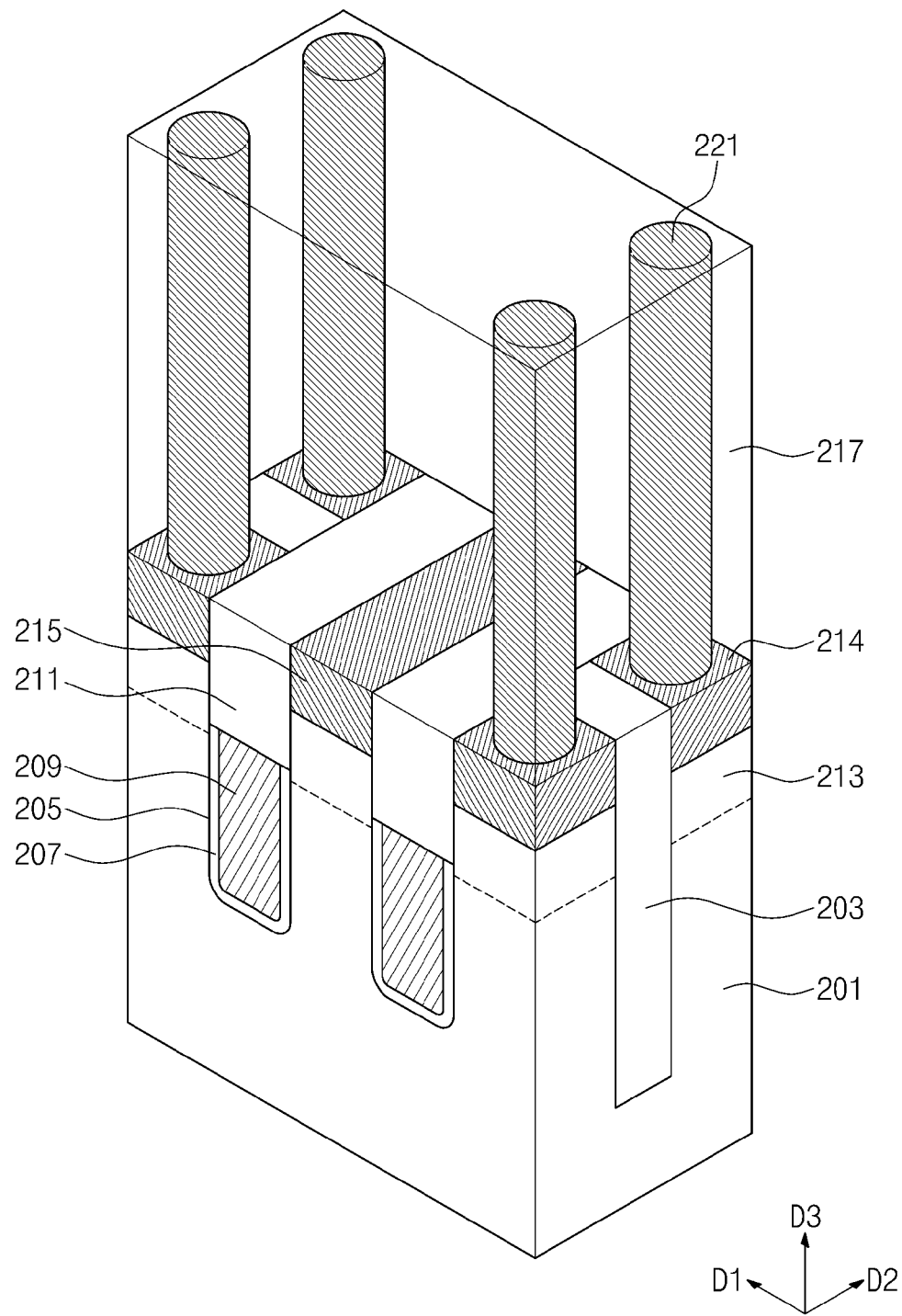

Referring to FIG. 10, the substrate 201 may be loaded in the chamber 1 of the PCM-PVD apparatus 100, and the processes described with reference to FIGS. 1 to 3 may be performed to form a contact plug 221 filling the contact hole 219. The contact plug 221 may be formed of an amorphous titanium nitride layer. An amount of nitrogen in the amorphous titanium nitride layer may be 3/10 or less than an amount of titanium in the amorphous titanium nitride layer.

Figure 11:
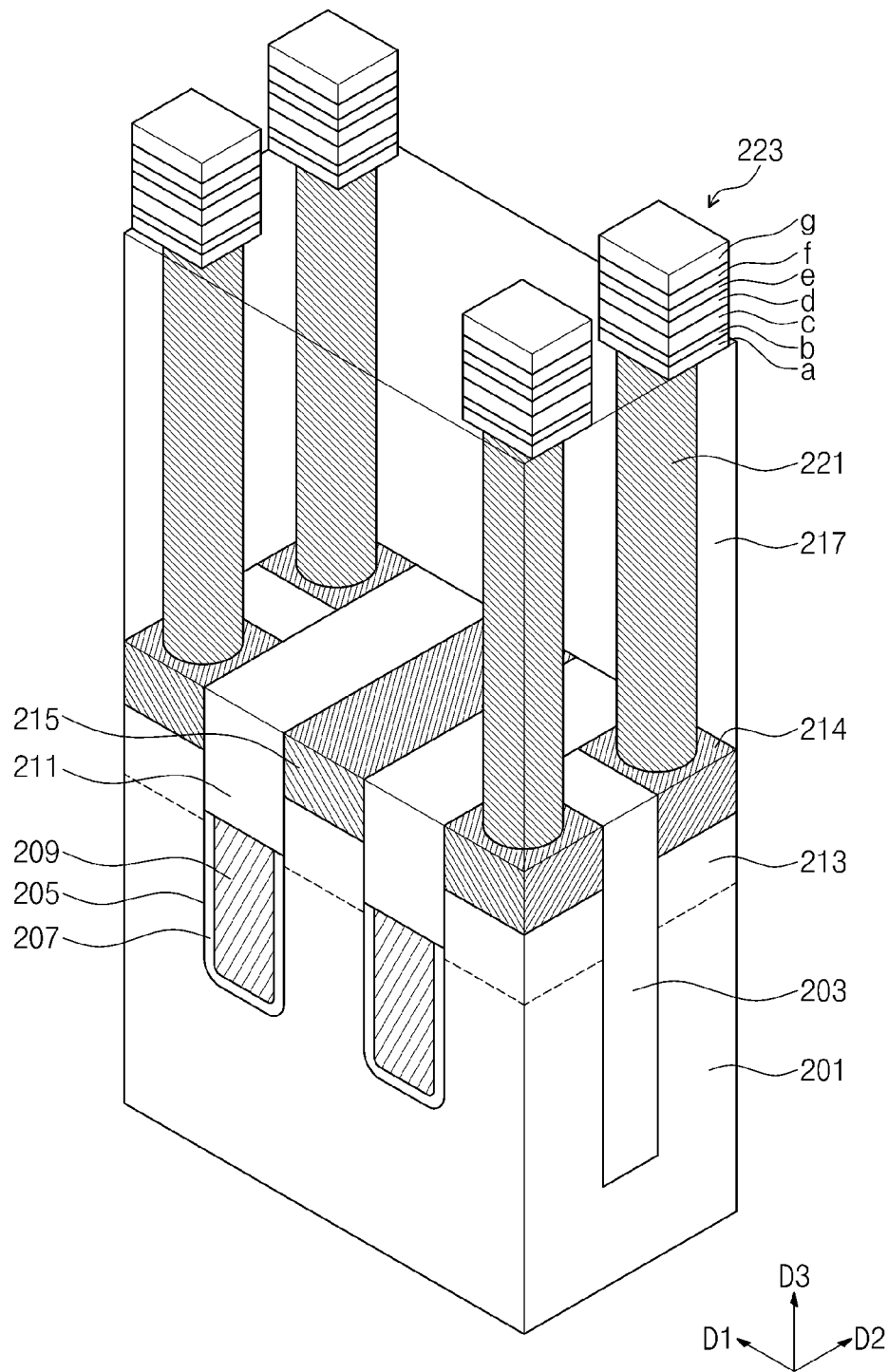

Referring to FIG. 11, a magnetic tunnel junction pattern 223 may be formed to contact the contact plug 221. The magnetic tunnel junction pattern 223 may comprise a first magnetic layer a, a tunnel barrier layer b, and reference layers c, d, e, f, and g. A stacking sequence of the first magnetic layer a, the tunnel barrier layer b, and the reference layers c to g may be reversed around the tunnel barrier layer b. For example, the first magnetic layer a may be disposed below the tunnel barrier layer b, and the reference layers c to g may be located above the tunnel barrier layer b. Alternatively, the first magnetic layer a may be disposed above the tunnel barrier layer b, and the reference layers c to g may be placed below the tunnel barrier layer b.

The first magnetic layer a may be referred to as a free layer. The reference layers c to g may be referred to as pinned layers. The reference layers c to g may include a second magnetic layer c, a capping layer d, a first pinned layer e, an exchange-coupling layer f, and a second pinned layer g. For example, the first magnetic layer a and the second magnetic layer c may comprise Co, Fe, and Ni atoms. The tunnel barrier layer b may comprise at least one of magnesium (Mg) oxide, titanium (Ti) oxide, aluminum (Al) oxide, magnesium-zinc (MgZn) oxide, magnesium-boron (MgB) oxide, titanium (Ti) nitride, and vanadium (V) nitride. The capping layer d may comprise at least one of Ta, $TaO_x$, Ti, $TiO_x$, Ru, $RuO_x$, Pb, Pd, Pt, and Au. The first and second pinned layers e and g may comprise nonmagnetic layers and ferromagnetic layers alternatively stacked. The ferromagnetic layer may include at least one of Fe, Co, and Ni. The nonmagnetic layer may include at least one of Cr, Pt, Pd, Ir, Ru, Rh, Os, Re, Au, and Cu. The exchange-coupling layer f may comprise at least one film including Mg, Al, Ti, Cr, Ru, Cu, Zn, Ta, Au, Ag, Pd, Rh, Ir, Mo, V, W, Nb, Zr, Y, Hf, or any combination thereof.

The first magnetic layer a, the tunnel barrier layer b, the second magnetic layer c, and the capping layer d may be sequentially stacked, and the first magnetic layer a and the second magnetic layer c may be crystallized by an annealing process, which forms the magnetic tunnel junction pattern 223. The annealing process may be performed after the magnetic tunnel junction pattern 223 is formed. The amorphous-structured contact plug 221 may have no effect on crystallization of the first magnetic layer a. If the contact plug 221 has a crystalline structure, the crystallization of the first magnetic layer a can be affected by the crystalline structure of the contact plug 221. Consequently, the first magnetic layer a may have no desired crystalline structure. In some example embodiments, the amorphous structure of the contact plug 221 may induce the effective crystallization of the first magnetic layer a and the second magnetic layer c, which increases a magnetoresistance ratio (MR) without the increasing of the resistance area (RA). The capping layer d may prevent or inhibit the first magnetic layer a and the second magnetic layer c from being oxidized in the annealing process. The capping layer d may maintain a vertical magnetization of the second magnetic layer c.

The first pinned layer e, the exchange-coupling layer f, and the second pinned layer g may be sequentially stacked and a magnetic field process may be performed. The reference layers c to g, the tunnel barrier layer b, and the first magnetic layer a may be patterned to form the magnetic tunnel junction pattern 223. When the reference layers c to g, the tunnel barrier layer b, and the first magnetic layer a are patterned, the amorphous titanium nitride layer may be used as an etching mask.

Figure 12:
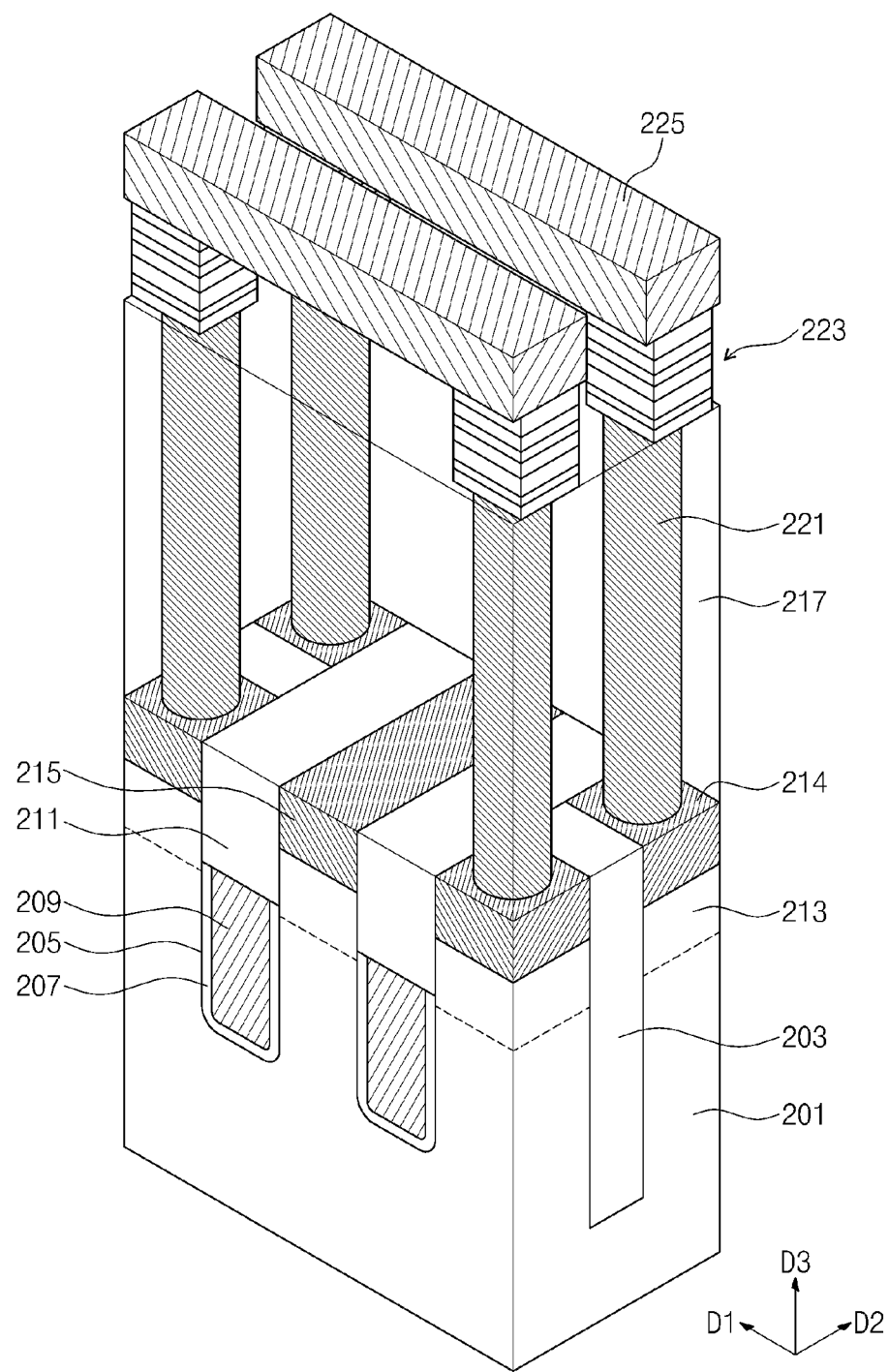

Referring to FIG. 12, a conductive line 225 extending in the first direction D1 may be formed to be in contact with the magnetic tunnel junction pattern 223.

Figure 13:
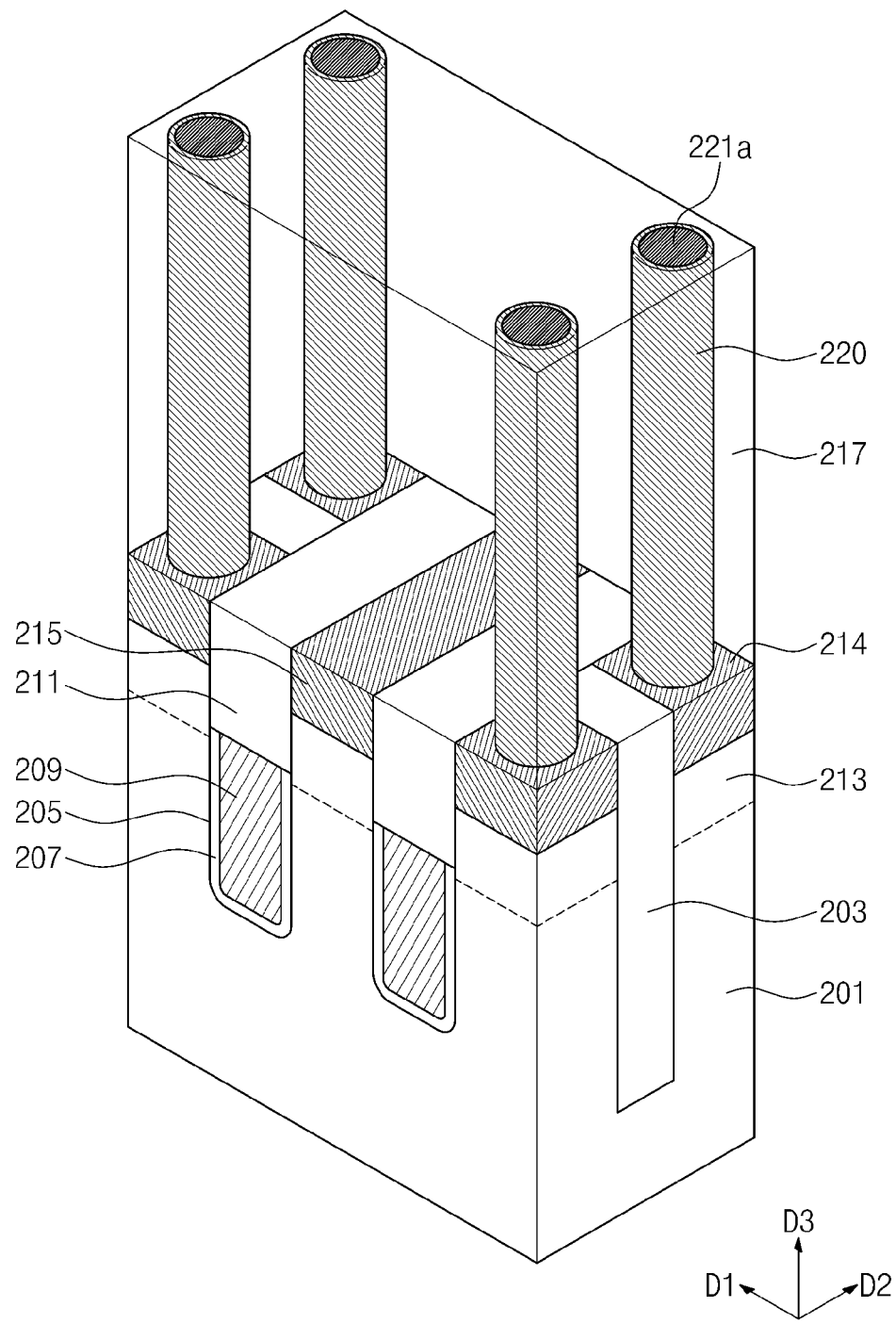
FIG. 13 is a perspective view illustrating a method for fabricating a magnetic memory device according to an example embodiment of the present inventive concepts.

FIG. 13 is a perspective view illustrating a method for fabricating a magnetic memory device according to an example embodiment of the present inventive concepts.

Referring to FIG. 13, inner and bottom sides of the contact hole 219 may be covered with a diffusion barrier layer 220, and the contact hole 219 may be filled with a contact plug 221a. The diffusion barrier layer 220 may comprise an amorphous titanium nitride layer, a titanium layer, a tantalum layer, or a titanium/tantalum layer. The contact plug 221a may comprise W, Al, Cu, or any combination thereof.

Figure 14A:
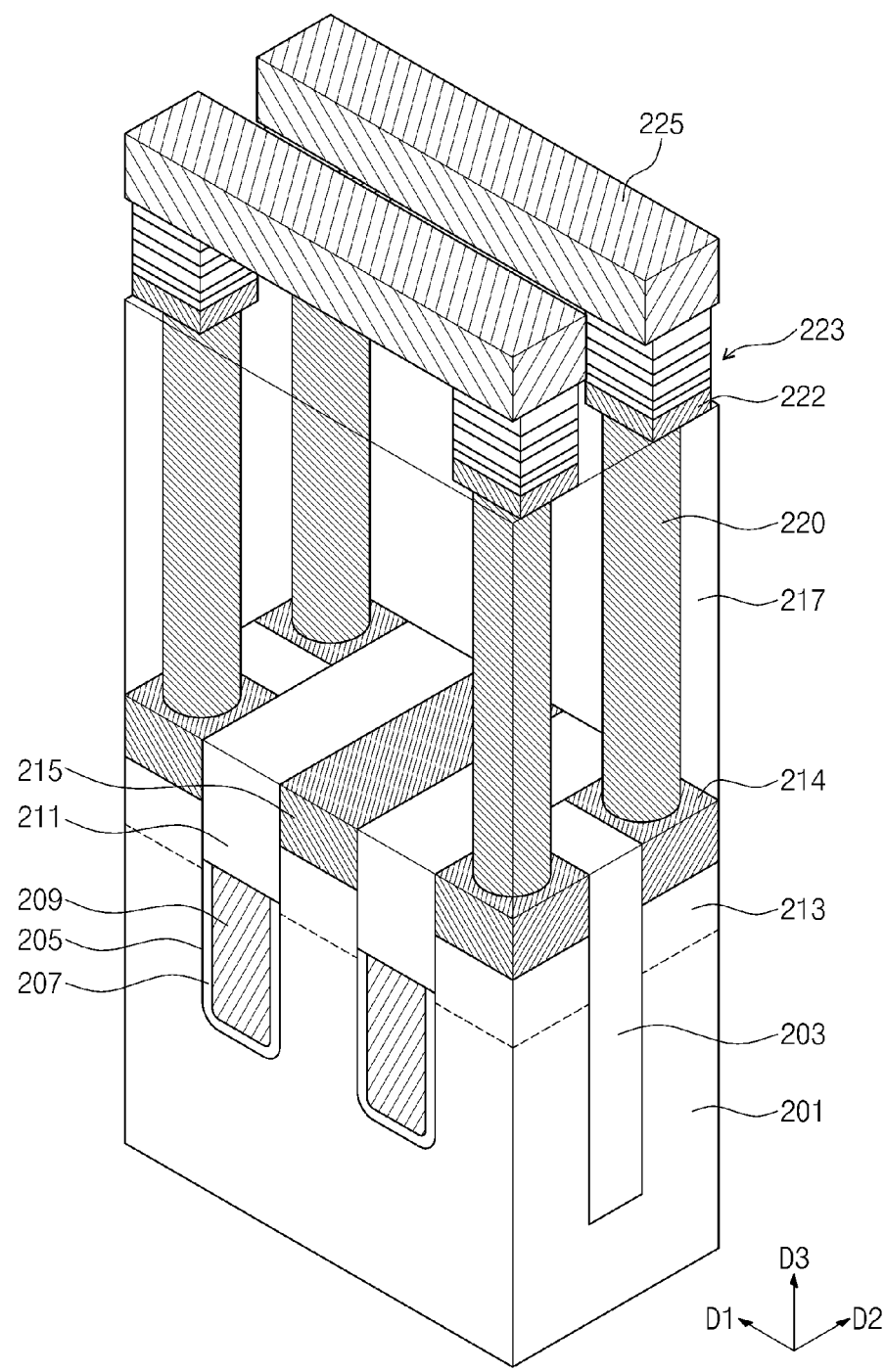
FIGS. 14A to 14C are perspective views illustrating magnetic memory devices according to another example embodiment of the present inventive concepts.
Figure 14B:
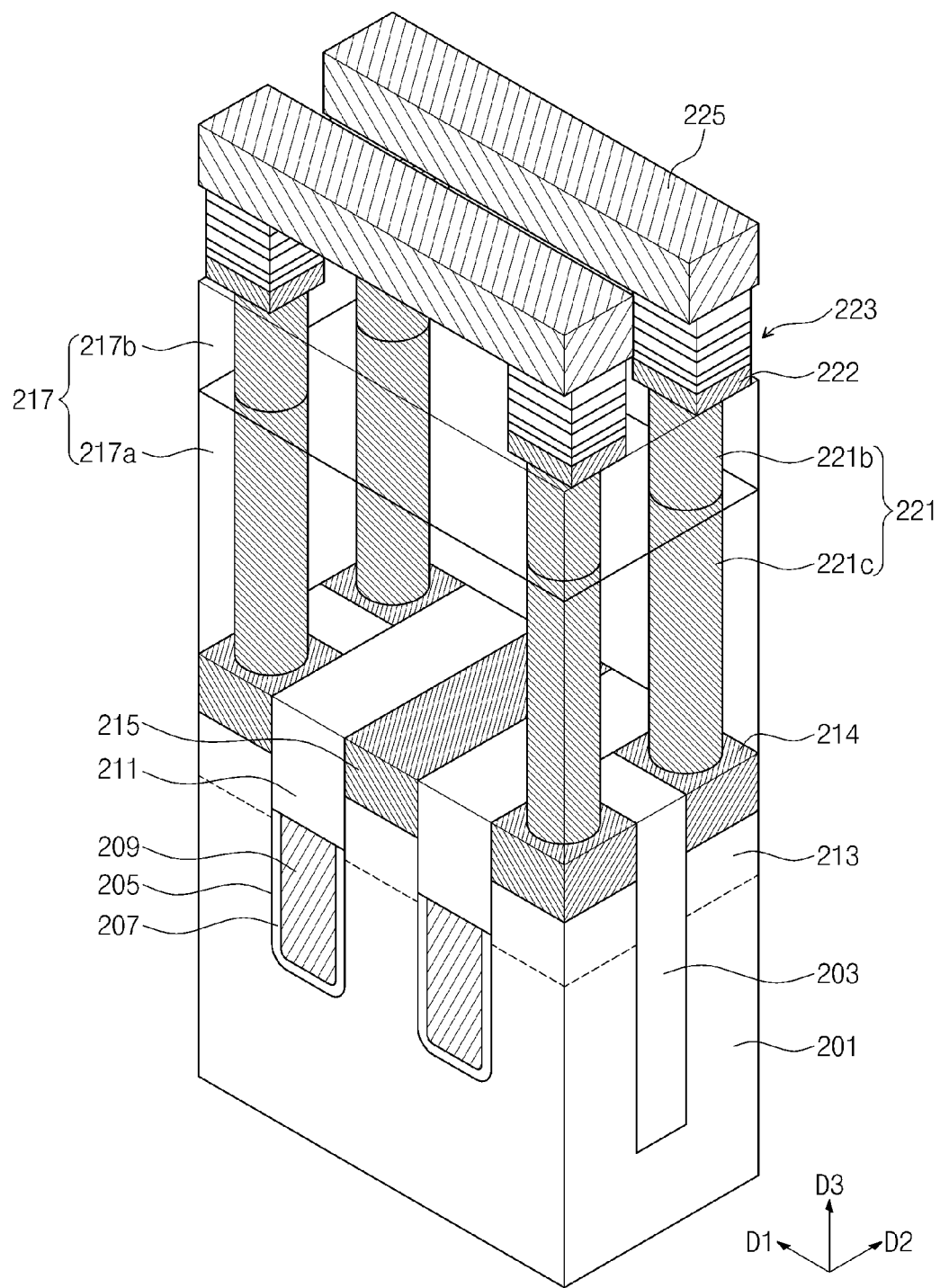
Figure 14C:
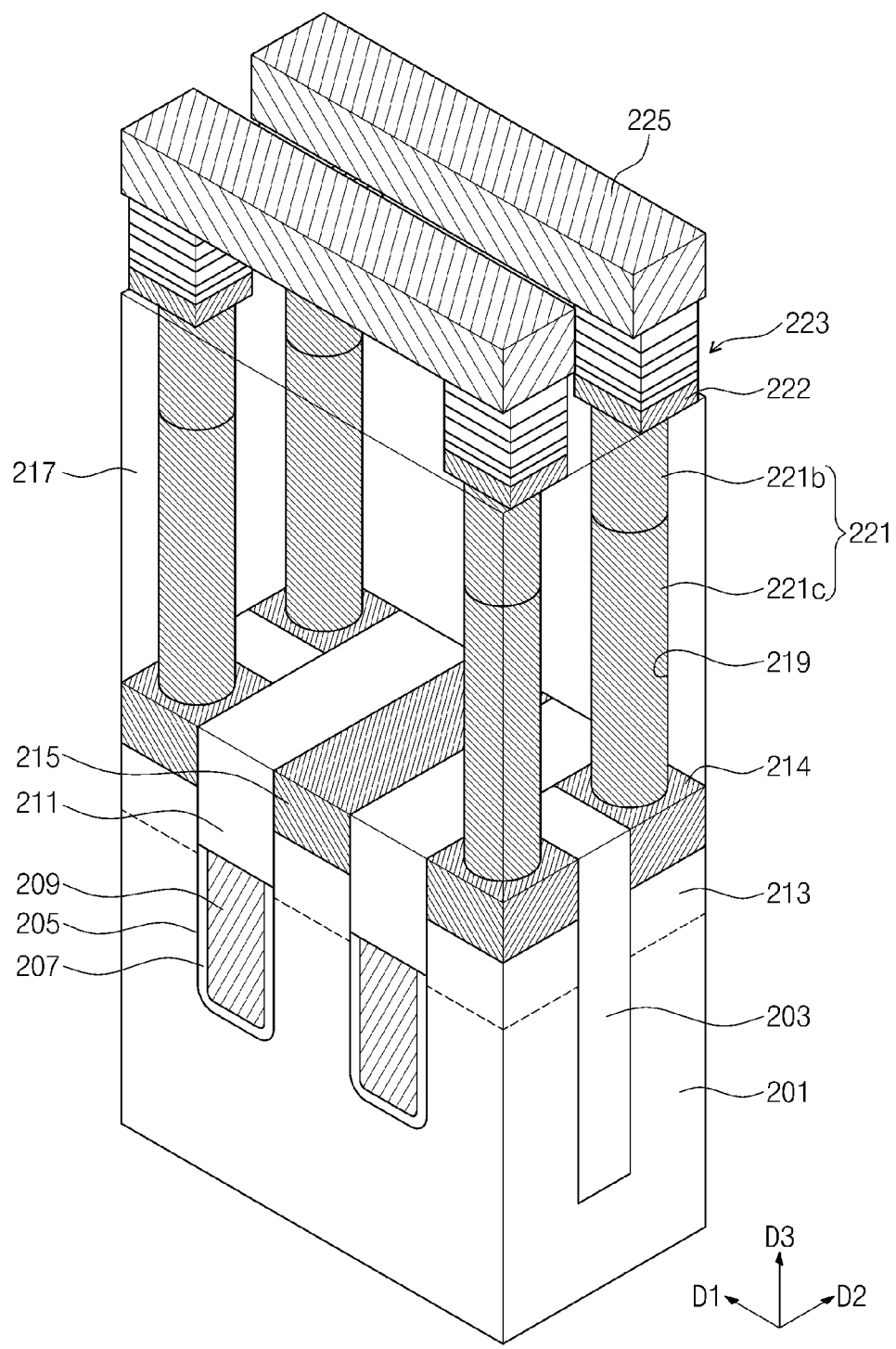

FIGS. 14A to 14C are perspective views illustrating magnetic memory devices according to another example embodiment of the present inventive concepts.

Referring to FIG. 14A, a lower electrode 222 may be further formed on the interlayer dielectric layer 217 below the magnetic tunnel junction pattern 223. The lower electrode 222 may comprise the amorphous titanium nitride layer formed by the above-mentioned method. The lower electrode 222 may be formed simultaneously with the formation of the magnetic tunnel junction pattern 223. The lower electrode 222 may have a sidewall aligned with a sidewall of the magnetic tunnel junction pattern 223.

Referring to FIG. 14B, the contact plug 221 may include a lower contact plug 221c and an upper contact plug 221b. The lower contact plug 221c may be formed by a chemical vapor deposition (CVD) and have a crystalline structure. The upper contact plug 221b may be formed by a point-cusp magnetron physical vapor deposition (PCM-PVD) and have an amorphous structure. The interlayer dielectric layer 217 may include a lower interlayer dielectric layer 217a and an upper interlayer dielectric layer 217b. The lower interlayer dielectric layer 217a may be formed, and the lower contact plug 221c may be formed to penetrate through the lower interlayer dielectric layer 217a. Thereafter, the upper interlayer dielectric layer 217b may be formed, and the upper contact plug 221b may be formed to penetrates through the upper interlayer dielectric layer 217b and be in contact with the lower contact plug 221c.

Referring to FIG. 14C, the contact plug 221 penetrating the interlayer dielectric layer 217 may include a lower contact plug 221c and an upper contact plug 221b. The lower contact plug 221c may be formed by a chemical vapor deposition (CVD) and have a crystalline structure. The upper contact plug 221b may be formed by a point-cusp magnetron physical vapor deposition (PCM-PVD) and have an amorphous structure. The contact hole 219 may be formed in the interlayer dielectric layer 217 and the lower contact plug 221c may be formed to fill the contact hole 219 by the CVD. An etch-back process may be performed to recess an upper portion of the lower contact plug 221c. The upper contact plug 221b may be formed in an upper portion of the contact hole 219.

In the magnetic memory devices as illustrated in FIGS. 14B and 14C, the contact plug 221 may include the lower contact plug 221c formed by the CVD and the upper contact plug 221b formed by the PCM-PVD. If the contact hole 219 has an aspect ratio greater than a limit of PCM-PVD step coverage, forming the contact plug 221 in a single process may be more difficult. In an example embodiment, the contact plug 221 may be formed by the processes as illustrated in FIG. 14B or 14C. Since the crystalline structure of the lower contact plug 221c formed by the CVD is blocked by the amorphous structure of the upper contact plug 221b formed by the PCM-PVD, the first magnetic layer a and the reference layers c to g of the magnetic tunnel junction pattern 223 may have improved crystalline characteristics.

Figure 15:
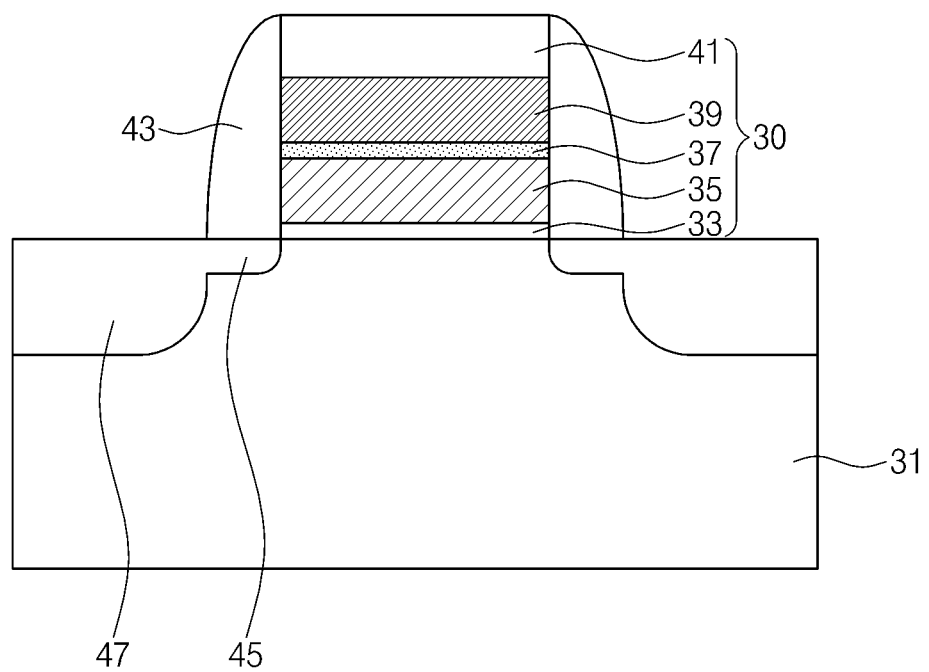
FIG. 15 is a cross-sectional view illustrating a semiconductor device according to still another example embodiment of the present inventive concepts.

FIG. 15 is a cross-sectional view illustrating a semiconductor device according to still another example embodiment of the present inventive concepts.

Referring to FIG. 15, a semiconductor device may comprise a stacking structure 30 including a gate dielectric layer 33, a polysilicon layer 35, an amorphous titanium nitride layer 37, a tungsten layer 39, and a capping layer 41 sequentially stacked on a substrate 31. Spacers 43 may be provided to cover sidewalls of the stacking structure 30. A lightly doped impurity region 45 and a heavily doped impurity region 47 may be provided at each lateral sides of the stacking structure 30. The tungsten layer 39 may correspond to a gate line. The tungsten layer 39 formed on the amorphous titanium nitride layer 37 may have a low sheet resistance due to its great grain size. As such, the semiconductor device may have improved signal transfer rate.

The amorphous titanium nitride layer 37 may be used as a diffusion barrier layer contacting a metal line (not shown), so that the metal line may have a relatively low sheet resistance which improves a signal transfer rate.

Figure 16:
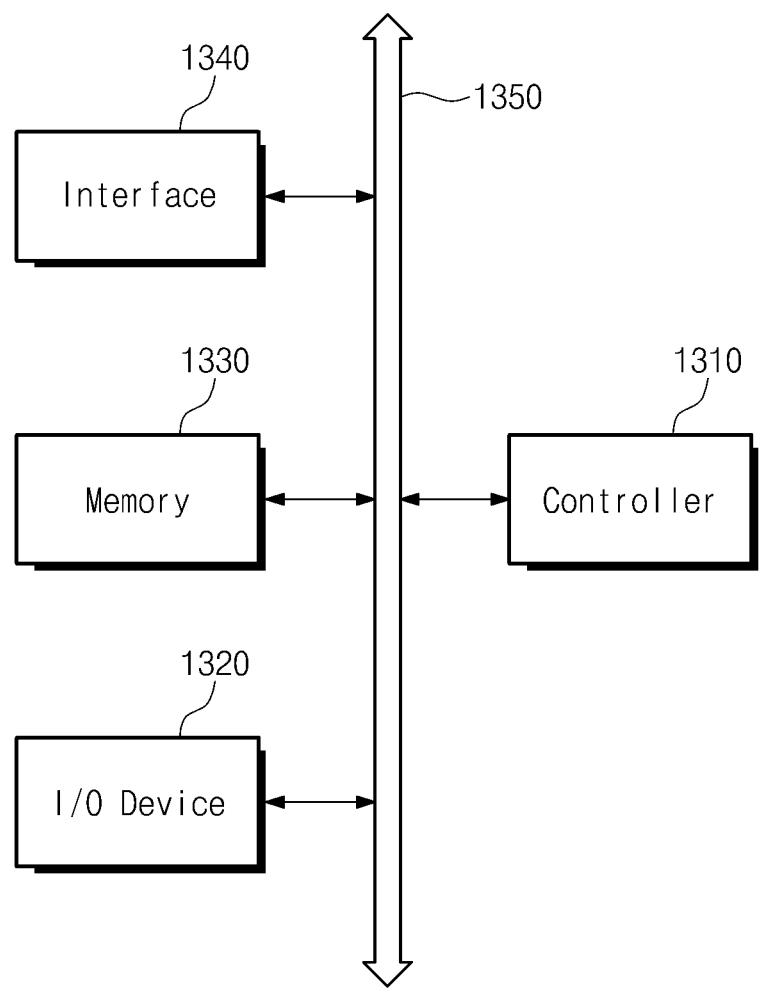
FIG. 16 is a block diagram illustrating an electronic system including a semiconductor memory device according to an example embodiment of the present inventive concepts.

FIG. 16 is a block diagram illustrating an electronic system including a semiconductor memory device according to an example embodiment of the present inventive concepts.

Referring to FIG. 16, an electronic system 1300 may comprise a controller 1310, an input/output device 1320, a memory 1330, an interface 1340, and a bus 1350. The controller 1310, the input/output device 1320, the memory 1330, and/or the interface 1340 may be electrically connected to each other by the bus 1350. The bus 1350 may correspond to data transfer paths.

The controller 1310 may include at least one of a microprocessor, a digital signal processor, a microcontroller, and a logic device capable of conducting functions similar to them. The input/output device 1320 may include a keypad, a keyboard, and a display. The memory 1330 may be one of the magnetic memory devices described above. The memory 1330 may further include a semiconductor memory device (e.g., FLASH, DRAM, and/or SRAM) different from the magnetic memory device. The interface 1340 may communicate data with communication networks. The interface 1340 may be a wire interface or a wireless interface. For example, the interface 1340 may include antennas, wire transceivers, or wireless transceivers. The electronic system 1300 may further include a high speed DRAM and/or SRAM as an operating memory to improve the operation of the controller 1310.

The electronic system 1300 may be applicable to PDAs, portable computers, web tablets, wireless phones, mobile phones, digital music players, memory cards, or any electronic appliances capable of wirelessly transmitting data.

As described above, the method comprises providing the inert gas and the reaction gas, and reacting the reaction gas with metal atoms separated from the metal target to form the amorphous metal nitride layer or metal oxide layer having improved step coverage. When the above-mentioned method is adopted to fabricate a magnetic memory device, it is possible to form a contact plug of an amorphous titanium nitride layer having improved step coverage. Therefore, when the magnetic tunnel junction pattern is formed on the amorphous titanium nitride layer, magnetic and reference layers included in the magnetic tunnel junction pattern have improved crystalline characteristics such that the magnetic memory device are fabricated to have improved properties. Moreover, since the contact plug is made of the amorphous titanium nitride layer, it is not necessary to form a lower electrode of an additional amorphous layer. Therefore, fabrication costs can be decreased.

When a contact hole formed below the magnetic tunnel junction pattern has an aspect ratio over the step coverage limit, forming the contact plug in a single process may be more difficult. According to an example embodiment, the contact plug can be formed to include a lower contact plug formed by a chemical vapor deposition process and an upper contact plug formed by a point-cusp physical vapor deposition process. As such, the crystalline structure of the lower contact plug can be blocked by the crystalline structure of the upper contact plug, which improves crystalline characteristics of magnetic and reference layers in the magnetic tunnel junction pattern.

Although the present inventive concepts have been described in connection with example embodiments illustrated in the accompanying drawings, it is not limited thereto. It will be apparent to those skilled in the art that various substitution, modifications and changes may be thereto without departing from the scope and spirit of the following claims.

What is claimed is:

1. A method for fabricating a semiconductor device, the method comprising:
   providing a wafer in a chamber of a point-cusp magnetron physical vapor deposition (PCM-PVD) apparatus, the chamber including a metal target;
   providing an inert gas and a reactive gas in the chamber; and
   forming an amorphous metal nitride layer on the wafer by reacting the reactive gas with a metal atom separated from the metal target by the inert gas, the amorphous metal nitride layer including an amorphous titanium nitride layer having an amount of nitrogen that is 3/10 or less than an amount of titanium.

2. The method of claim 1, wherein
   the wafer comprises an interlayer dielectric layer formed thereon, the interlayer dielectric layer including a recess region, and
   the forming forms the amorphous metal nitride layer filling the recess region.

3. The method of claim 2, wherein the recess region comprises a contact hole, the method further comprising:
   forming a crystalline conductive pattern filling a lower part of the contact hole before the forming an amorphous metal nitride layer.

4. The method of claim 3, wherein the forming forms the crystalline conductive pattern by a chemical vapor deposition process.

5. The method of claim 1, wherein the providing an inert gas and a reactive gas provides the reactive gas including at least one of nitrogen, ammonia, oxygen, and vapor.

6. The method of claim 1, further comprising:
   unloading the wafer from the chamber; and
   forming one of a magnetic tunnel junction pattern and a metal line pattern on the amorphous titanium nitride layer.

7. A method for fabricating a magnetic memory device, the method comprising:
   patterning an interlayer dielectric layer on a substrate to form a recess region therein;
   forming a contact plug filling the recess region, the contact plug including an amorphous titanium nitride layer; and
   forming a magnetic tunnel junction pattern on the contact plug,
   wherein the forming a magnetic tunnel junction pattern forms a first magnetic layer, a tunnel barrier layer, and a reference layer on the amorphous titanium nitride layer, and
   wherein the reference layer includes a second magnetic layer, a capping layer, a first pinned layer, an exchange-coupling layer, and a second pinned layer that are sequentially stacked on the tunnel barrier layer.

8. The method of claim 7, wherein the forming a contact plug forms the amorphous titanium nitride layer to include an amount of nitrogen that is 3/10 or less than an amount of titanium.

9. The method of claim 7, wherein the forming a contact plug forms the amorphous titanium nitride layer constituting a lower electrode.

10. The method of claim 9, wherein the forming a contact plug forms the amorphous titanium nitride layer including a sidewall aligned with a sidewall of the magnetic tunnel junction pattern.

11. The method of claim 7, wherein the forming a contact plug forms a crystalline conductive pattern under the amorphous titanium nitride layer.

12. A method for fabricating a magnetic memory device, the method comprising:
    forming at least one interlayer dielectric layer on a substrate;
    forming a lower contact plug penetrating at least a first portion of the at least one interlayer dielectric layer by a chemical vapor deposition process (CVD);
    forming an upper contact plug penetrating at least a second portion of the at least one interlayer dielectric layer by a point-cusp magnetron physical vapor deposition (PCM-PVD) process;
    forming a lower electrode on the at least one interlayer dielectric layer; and
    forming a magnetic tunnel junction pattern on the lower electrode.

13. The method of claim 12, wherein
    the forming a lower contact plug forms the lower contact plug having a crystalline structure, and
    the forming an upper contact plug forms the upper contact plug having an amorphous structure.

14. The method of claim 12, further comprising:
    patterning the at least one interlayer dielectric layer to form a contact hole in the at least one interlayer dielectric layer prior to the forming a lower contact plug, wherein the lower contact plug fills the contact hole.

15. The method of claim 14, further comprising:
    performing an etch-back process to recess an upper portion of the lower contact plug prior to the forming an upper contact plug, wherein the upper contact plug is formed in the recessed upper portion.

16. The method of claim 12, wherein
    the forming at least one interlayer dielectric layer forms first and second interlayer dielectric layers on the substrate,
    the forming a lower contact plug forms the lower contact plug to penetrate the first interlayer dielectric layer, and
    the forming an upper contact plug forms the upper contact plug to penetrate the second interlayer dielectric layer.

17. The method of claim 12, wherein the forming a lower electrode forms the lower electrode including an amorphous titanium nitride layer having an amount of nitrogen that is 3/10 or less than an amount of titanium.

18. The method of claim 12, wherein
    the forming a magnetic tunnel junction pattern forms a first magnetic layer, a tunnel barrier layer, and a reference layer on the lower electrode,
    the reference layer including a second magnetic layer, a capping layer, a first pinned layer, an exchange-coupling layer, and a second pinned layer that are sequentially stacked on the tunnel barrier layer.

* * * * *